United States Patent [19]
Tajima

[11] Patent Number: 5,321,250
[45] Date of Patent: Jun. 14, 1994

[54] SOLID STATE IMAGE PICKUP DEVICE WITH OPTICAL FILTER FREE FROM AGE DETERIORATION

[75] Inventor: Kazuhisa Tajima, Kumamoto, Japan

[73] Assignee: NEC Corporation, Tokyo, Japan

[21] Appl. No.: 974,221

[22] Filed: Nov. 10, 1992

[30] Foreign Application Priority Data

Nov. 12, 1991 [JP] Japan .................................. 3-295371

[51] Int. Cl.$^5$ .......................... H01J 40/14; H01J 3/14
[52] U.S. Cl. .................................. 250/208.1; 250/216; 430/7
[58] Field of Search .............................. 250/208.1, 216; 257/290, 291, 294; 430/7, 24, 339

[56] References Cited

U.S. PATENT DOCUMENTS

| | | | |
|---|---|---|---|
| 4,418,284 | 11/1983 | Ogawa et al. | 257/435 |
| 4,425,416 | 1/1984 | Ogawa | 430/7 |
| 4,600,833 | 7/1986 | Shibata et al. | 250/216 |

Primary Examiner—David C. Nelms
Assistant Examiner—Stephone B. Allen
Attorney, Agent, or Firm—Burns, Doane, Swecker & Mathis

[57] ABSTRACT

A solid state image pickup device is equipped with an optical color filter over an image sensor, and a protective filter film is provided over the optical filter for eliminating ultra-violet light from optical radiation carrying an visible image so that the coloring agent of the optical color filter is not decomposed, thereby prolonging the service time of the optical color filter.

11 Claims, 6 Drawing Sheets

SOLID STATE IMAGE PICKUP DEVICE WITH OPTICAL FILTER FREE FROM AGE DETERIORATION

FIELD OF THE INVENTION

This invention relates to a solid state image pickup device and, more particularly, to an optical filter incorporated in the solid state image pickup device.

DESCRIPTION OF THE RELATED ART

A typical example of the solid state image pickup device is illustrated in FIG. 1 of the drawings, and is fabricated on a semiconductor substrate 1. Photo-electric converting elements 2 are arranged in the surface portion of the semiconductor substrate 1, and are accompanied with shift registers 3. The photo-electric converting elements 2 and the shift registers 3 are covered with an insulting film 4, and an optical filter 5 is provided on the insulating film 4. The optical filter 5 is implemented by three or four optical filter arrays 5a, 5b and 5c to be laminated, and transparent inter-level insulating films 5d are inserted therebetween. The optical filter arrays 5a, 5b and 5c are different in spectrum characteristics from one another, and a transparent top surface film 6 covers the optical filter 5 so as to create a smooth top surface.

The optical filter 5 thus arranged is fabricated through the following process. First, a film of non-colored substance is formed on the insulating film 4, and is patterned into an element array corresponding to the filter element array 5c. Solution of a coloring agent is prepared for the element array, and the element array is dipped into the solution. Then, the element array is colored so that the filter element array 5c exhibits predetermined spectrum characteristics in the visible region. One of the transparent inter-level insulating films 5d is deposited over the filter element array 5c, and the above described process sequence is twice repeated for the filter element arrays 5b and 5a. However, solution of coloring agent is changed so that the filter element arrays 5c, 5b and 5a have respective spectrum characteristics different from one another.

A problem is encountered in the prior art solid state image pickup device in that the optical filter 5 tends to change the predetermined spectrum characteristics. The spectrum characteristics change between completion of the prior art solid state image pickup device and installation into a video camera.

SUMMARY OF THE INVENTION

It is therefore an important object of the present invention to provide a solid state image pickup device the optical filter of which keeps predetermined spectrum characteristics.

The present inventor analyzed the change in the spectrum characteristics, and found that the colored filter elements increased the transmittance under optical radiation. This is because of the fact that the coloring agents were decomposed in the presence of the light energy, and ultra-violet light promoted the decomposition of the coloring agents.

To accomplish the object, the present invention proposes to absorb invisible light such as ultra-violet light incorporated in an image carrying light.

In accordance with the present invention, there is provided a solid state image pickup device fabricated on a semiconductor substrate, comprising: a) an image sensor formed on the semiconductor substrate for converting optical radiation carrying a visual image into an electric signal indicative of the visual image; b) a first interlevel insulating film covering the image sensor, and transparent to the optical radiation; c) an optical color filter provided on the first inter-level insulating film, and having predetermined spectrum characteristics to visible light incorporated in the optical radiation; and d) a protective means provided over the optical filter for eliminating invisible light incorporated in the optical radiation, and substantially transparent to the visible light.

BRIEF DESCRIPTION OF THE DRAWINGS

The feature and advantages of the solid state image pickup device with the optical filter according to the present invention will be more clearly understood from the following description taken in conjunction with the accompanying drawings in which.

DESCRIPTION OF THE PREFERRED EMBODIMENTS

First Embodiment

Figure 2:
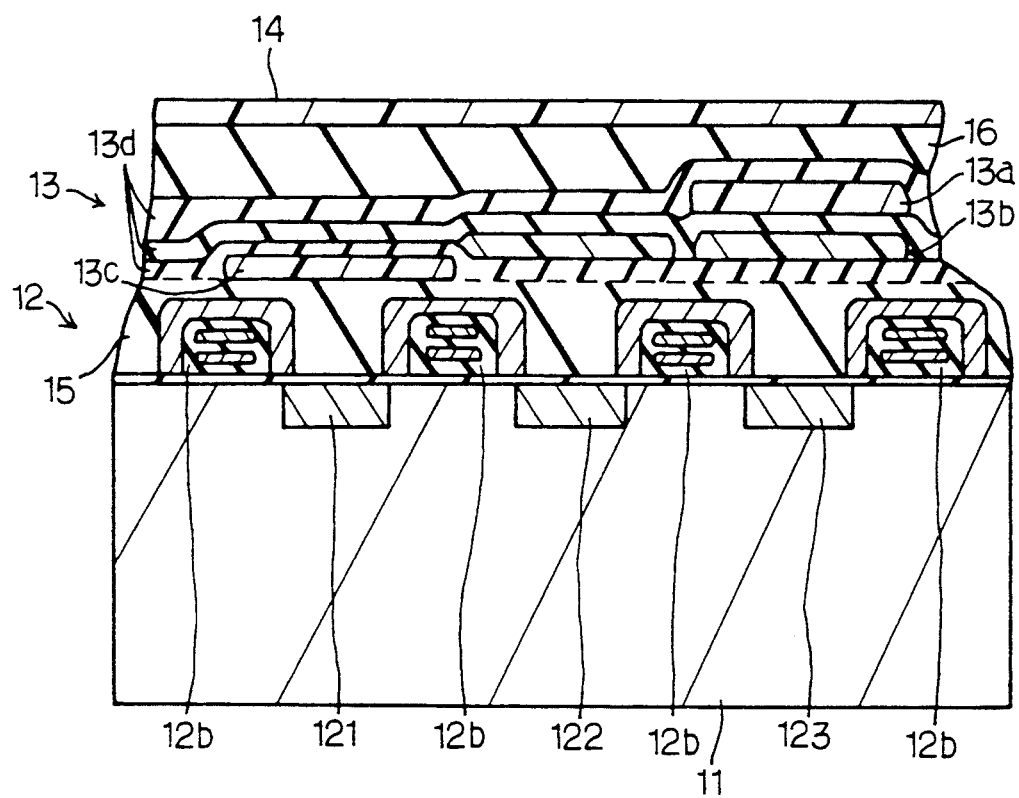
FIG. 2 is a cross sectional view showing the structure of a solid state image pickup device with an optical filter according to the present invention.

Referring to FIG. 2 of the drawings, a solid state image pickup device embodying the present invention is fabricated on a single semiconductor chip 11, and largely comprises an image sensor 12, an optical color filter 13 provided over the image sensor 12 and a protective filter film 14 associated with the optical filter 13. The image sensor 12 comprises an array of photo-electric converting elements broken down into first, second and third photo-electric converting element sub-arrays 121, 122 and 123 formed in a surface portion of the semiconductor substrate 11, charge transfer registers 12b associated with the array of photo-electric converting elements 12a for transferring charge packets therealong, and an output circuit (not shown) coupled with the final stages of the charge transfer registers 12b for producing an electric signal indicative of an image carried by an optical radiation. A transparent inter-level insulating film 15 covers the image sensor 12, and the optical color filter 13 is provided on the transparent inter-level color filter 15.

The optical color filter 13 comprises first, second and third filter element arrays 13a, 13b and 13c and transparent inter-level films 13d, and the transparent inter-level films 13d covers the first, second and third filter element arrays 13a to 13c, respectively. The first, second and third filter element arrays 13a to 13c are different in spectrum characteristics to visible light from one another. The first and second filter element arrays 13a and 13b are provided over the third photo-electric converting element sub-array 123, and the second and third filter element arrays 13b and 13c are respectively located over the first and second photo-electric converting element sub-arrays 121 and 122.

A transparent inter-level film 16 covers the optical color filter 13, and creates a smooth top surface. The protective filter film 14 is formed on the smooth top surface of the transparent inter-level film 16. The protective filter film 14 is formed of casein, and the casein film is colored by using transparent dye of naphthalene compound, benzophenone compound or phenol compound. The protective filter film 14 has a predetermined absorption spectrum, and, accordingly, effectively absorbs a predetermined wavelength region close to the ultra-violet region outside the visible light region. In this description, the visible light region ranges from 400 nanometers to 700 nanometers.

Figure 3B:
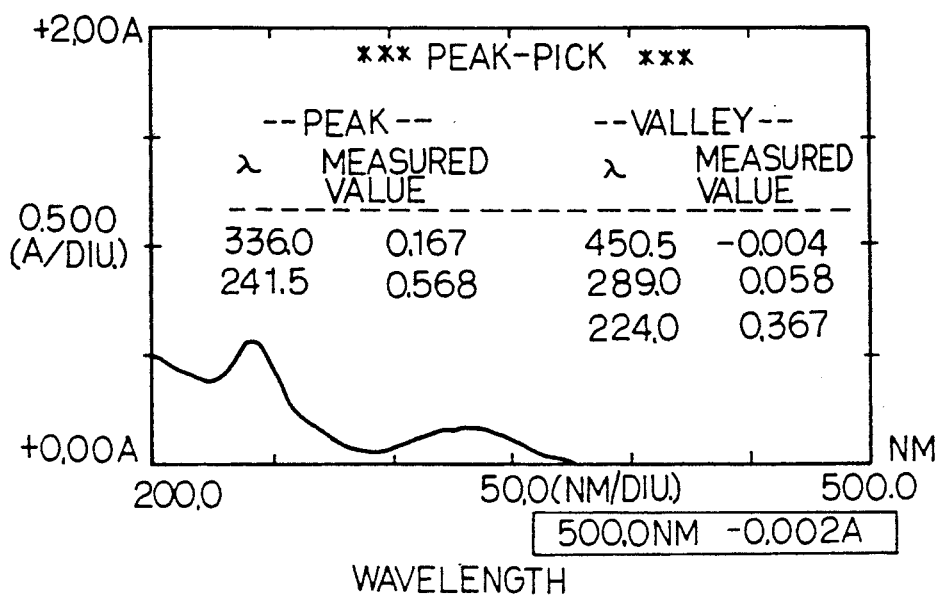
FIG. 3B is a graph showing the spectrum characteristics of the coloring agent shown in FIG. 3A.
Figure 3A:
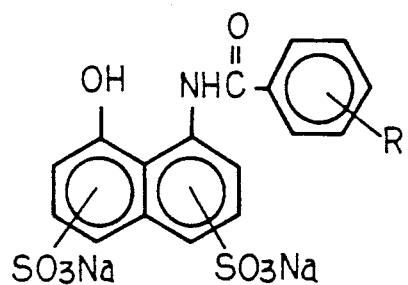
FIG. 3A is a view showing the structural formula of a coloring agent contained in a protective filter according to the present invention.

If the transparent dye is of naphthalene compound, the structural formula is given as shown in FIG. 3A, and the spectrum characteristics thereof are illustrated in FIG. 3B. In the measurement of the spectrum characteristics, the dye of 1 gram liter was a hundred times diluted.

Figure 4B:
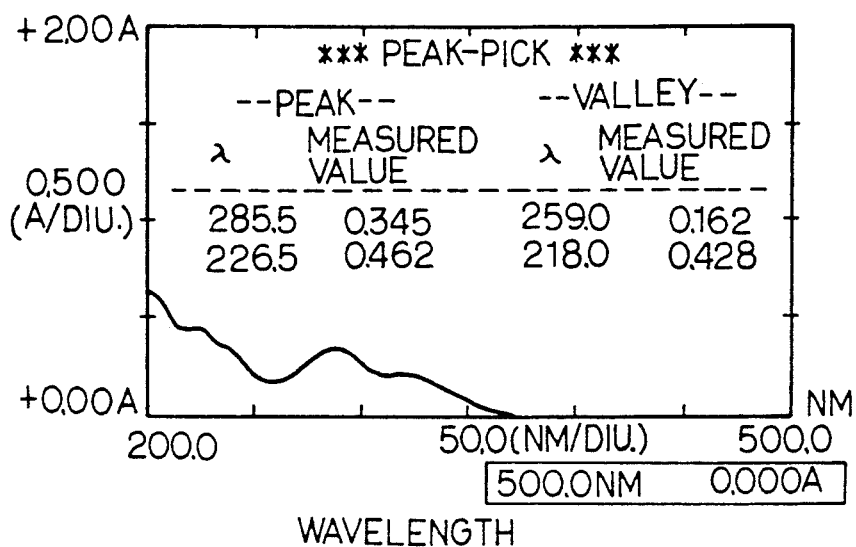
FIG. 4B is a graph showing the spectrum characteristics of the coloring agent shown in FIG. 4A.
Figure 4A:
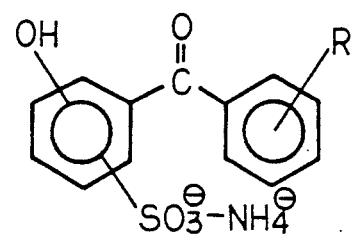
FIG. 4A is a view showing the structural formula of another coloring agent available for the protective filter.

If the transparent dye is in the benzophenone compound, the structural formula is given as shown in FIG. 4A, and the spectrum characteristics thereof are illustrated in FIG. 4B. In the measurement, the dye of 1 gram liter was a hundred times diluted as similar to the dye in the naphthalene compound.

Figure 5B:
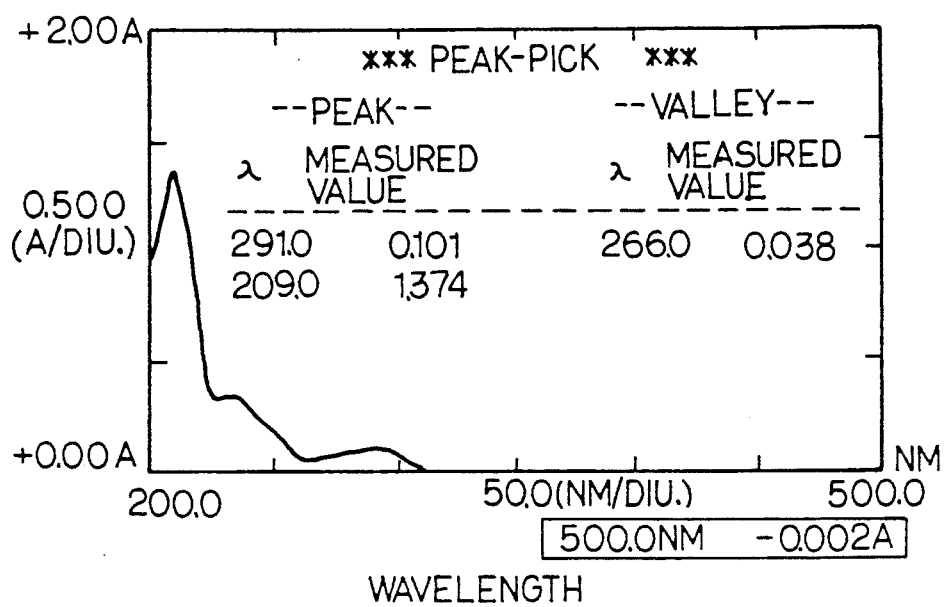
FIG. 5B is a graph showing the spectrum characteristics of the coloring agent shown in FIG. 5A.
Figure 5A:
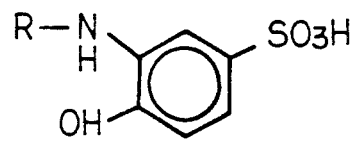
FIG. 5A is a view showing the structural formula of yet another coloring agent available for the protective filter.

Furthermore, the transparent dye in the phenol compound has the structural formula shown in FIG. 5A, and the spectrum characteristics thereof are illustrated in FIG. 5B. The measurement of the spectrum characteristics was also carried out with the dye of 1 gram liter a hundred times diluted.

The absorption spectrum is variable with the dye as described hereinbefore. The thickness of the protective filter film 14 further affects the absorption spectrum thereof. As a result, the absorption spectrum is regulable with the dye contained in the casein film as well as the thickness of the casein film.

The solid state image pickup device according to the present invention is incorporated in, for example, a video camera. However, the solid state image pickup device may be incorporated in various optical devices.

Figure 1:
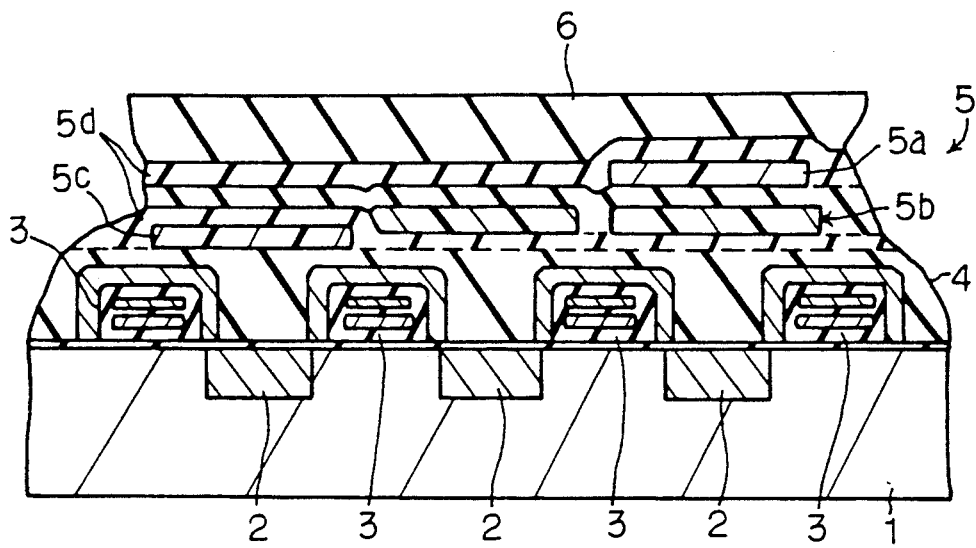
FIG. 1 is a cross sectional view showing the structure of the prior art solid state image pickup device with the optical filter.
Figure 6:
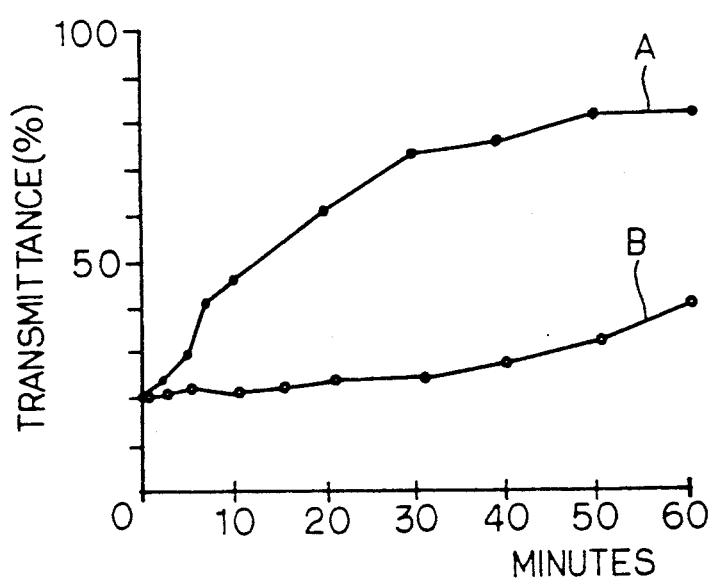
FIG. 6 is a graph showing the transmittance of the optical color filter according to the present invention in comparison with that of the prior art optical color filter.

The protective filter film 14 is effective against aged deterioration. FIG. 6 shows the transmittance in terms of time. In detail, using casein films colored with azo compound for imparting spectrum characteristics to complementary red, the transmittance was measured under radiation of light at 535 nanometers. Plots A are indicative of the transmittance under direct radiation of the light, and plots B are indicative of the transmittance under radiation through the protective filter film 14 according to the present invention. Comparing plots A with plots B, it is understood that the colored casein film under the direct radiation increased the transmittance rather than that under the indirect radiation through the protective filter film 14. This means that the protective filter film 14 effectively cut off the invisible light, and the azo compound was rescued from decomposition. In other words, the protective filter film 14 is effective against the aged deterioration.

Second Embodiment

Figure 7:
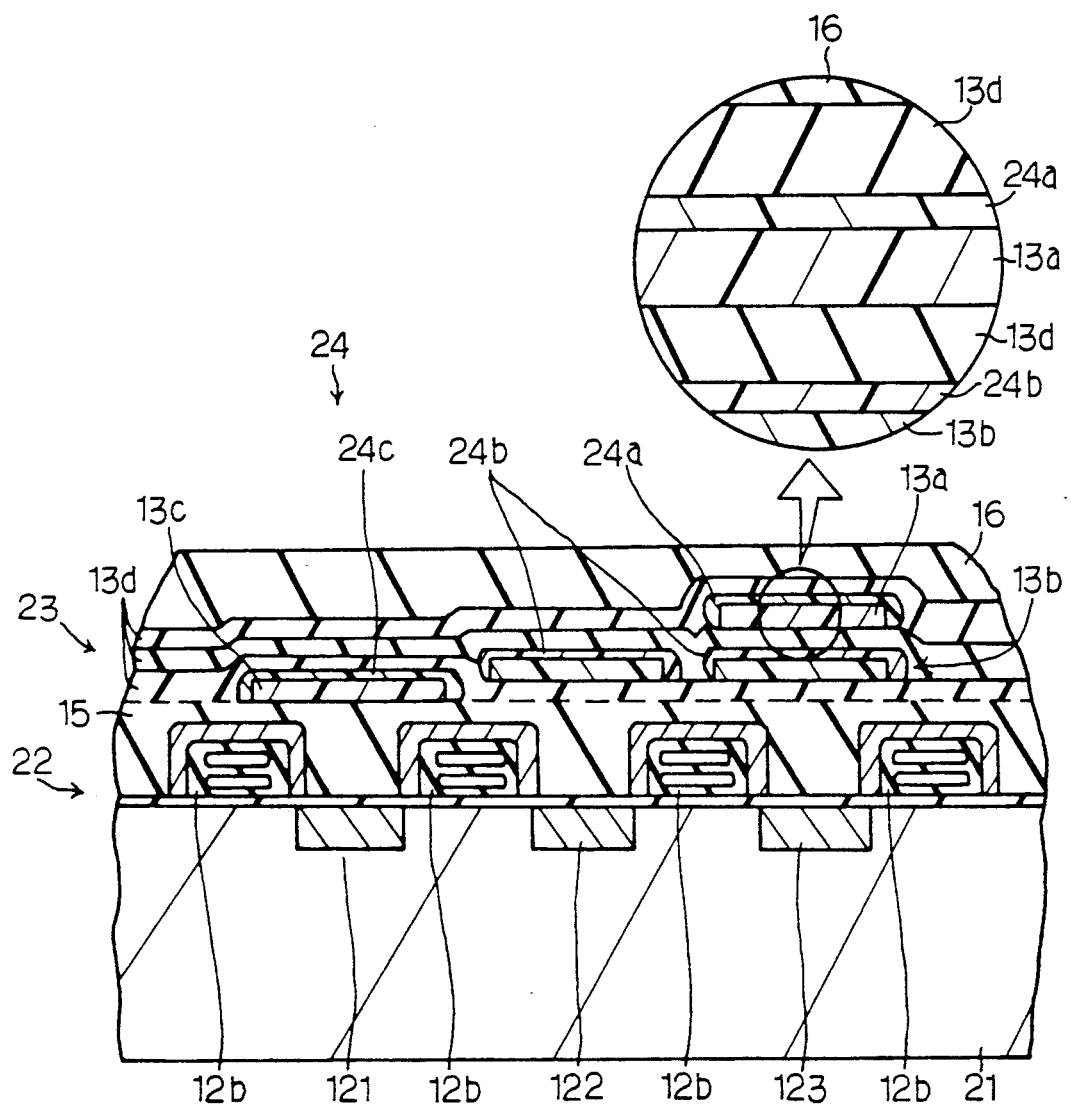
FIG. 7 is a cross sectional view showing the structure of another solid state image pickup device according to the present invention.

Turning to FIG. 7 of the drawings, another solid state image pickup device embodying the present invention largely comprises an image sensor 22, an optical color filter 23 and a protective filter 24. The image sensor 22 and the optical color filter 23 are respectively similar in structure to the image sensor 12 and the optical color filter 13, and component films and regions are labeled with the same references as those of the first embodiment without detailed description.

The protective filter 24 is implemented by protective filter films 24a, 24b and 24c, and the protective filter films 24a, 24b and 24c respectively covers the color filter films 13a, 13b and 13c. The protective filter films 24a to 24c are formed through introduction of the dye of naphthalene compound, benzophenone compound or phenol compound into surface portions of the color filter films 13a to 13c. The protective filter films 24a to 24c protect the color filter films 13a to 13c against radiation of invisible light prior to completion of the solid state image pickup device, and the optical color filter 23 does not suffer from radiation of invisible light in the process sequence.

As will be appreciated from the foregoing description, the protective filter according to the present invention eliminates invisible light from the incident optical radiation, and prevents the coloring agent contained in the color filter films from decomposition. This results in that the optical color filter is free from the aged deterioration, and the service time period is prolonged.

Although particular embodiments of the present invention have been shown and described, it will be obvious to those skilled in the art that various changes and modifications may be made without departing from the spirit and scope of the present invention. For example, a color filter may be implemented by a single layer of filter elements. Moreover, the protective filter films 24a to 24c may be formed of casein films containing the dye separately from the color filter films 13a to 13c, and the protective filter films 24a to 24c thus separately formed are exactly regulable in dimensions as well as in optical characteristics.

What is claimed is:

1. A solid state image pickup device fabricated on a semiconductor substrate, comprising:
   a) an image sensor formed on said semiconductor substrate for converting optical radiation carrying a visual image into an electric signal indicative of the visual image;
   b) a first inter-level insulating film covering said image sensor, and transparent to said optical radiation;
   c) an optical color filter provided on said first inter-level insulating film, and having predetermined spectrum characteristics with respect to visible light incorporated in said optical radiation; and
   d) a protective filter means provided over said optical filter operative to eliminate invisible light from said optical radiation for protecting said optical color filter against deterioration due to said invisible light, and substantially transparent to said visible light.

2. A solid state image pickup device as set forth in claim 1, in which said protective filter means has an absorption spectrum effective against a wavelength region closer to ultra-violet light region.

3. A solid state image pickup device as set forth in claim 2, in which said protective filter means is implemented by a protective filter film covering said optical color filter.

4. A solid state image pickup device as set forth in claim 3, in which said protective filter film is formed of a casein film containing a dye of naphthalene compound.

5. A solid state image pickup device as set forth in claim 3, in which said protective filter film is formed of a casein film containing benzophenone compound.

6. A solid state image pickup device as set forth in claim 3, in which said protective filter film is formed of a casein film containing phenol compound.

7. A solid state image pickup device as set forth in claim 2, in which said protective filter means is implemented by a plurality of protective filter films respectively covering optical color filter films incorporated in said optical color filter.

8. A solid state image pickup device as set forth in claim 7, in which said protective filter film is formed of a casein film containing a dye of naphthalene compound.

9. A solid state image pickup device as set forth in claim 7, in which said protective filter film is formed of a casein film containing benzophenone compound.

10. A solid state image pickup device as set forth in claim 7, in which said protective filter film is formed of a casein film containing phenol compound.

11. An optical filter unit provided for an optical device comprising:
a) a multi-level optical color filter having color filter layers different in spectrum characteristics and substantially transparent to visible light of optical radiation; and
b) a protective filter covering said multi-level optical color filter, and operative to eliminate invisible light closer to ultra-violet light from said optical radiation.

* * * * *